(12) United States Patent
Shini

(10) Patent No.: US 8,765,610 B2
(45) Date of Patent: Jul. 1, 2014

(54) METHOD FOR MANUFACTURING SEMICONDUCTOR DEVICE

(75) Inventor: Masato Shini, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,418

(22) Filed: Aug. 31, 2012

(65) Prior Publication Data

US 2013/0230988 A1 Sep. 5, 2013

(30) Foreign Application Priority Data

Sep. 20, 2011 (JP) ................................. 2011-204527

(51) Int. Cl.
*H01L 21/311* (2006.01)

(52) U.S. Cl.
USPC ........... 438/703; 438/478; 438/669; 438/382; 438/717; 438/736; 257/E21.295; 257/E21.03; 257/E21.236; 257/E21.004; 257/E21.09

(58) Field of Classification Search
CPC ...................... H01L 45/1691; H01L 21/30655; H01L 27/1425; H01L 21/3088; H01L 2224/03466; H01L 2224/05018; H01L 2224/05019; H01L 2224/05558; H01L 2224/11466
USPC .......... 438/703, 478, 669, 382; 257/E21.295, 257/E21.004, E21.09
See application file for complete search history.

(56) References Cited

U.S. PATENT DOCUMENTS

| | | | |
|---|---|---|---|
| 7,253,118 B2 * | 8/2007 | Tran et al. ..................... | 438/717 |
| 7,592,223 B2 * | 9/2009 | Pham et al. .................... | 438/258 |
| 8,062,944 B2 * | 11/2011 | Higashitani ................... | 438/257 |
| 8,154,005 B2 * | 4/2012 | Hsia et al. ........................ | 257/5 |
| 2008/0248622 A1 * | 10/2008 | Matamis et al. .............. | 438/261 |
| 2009/0111270 A1 * | 4/2009 | Choi .............................. | 438/694 |
| 2010/0038616 A1 * | 2/2010 | Nagashima et al. ............. | 257/2 |
| 2010/0052030 A1 | 3/2010 | Sakaguchi et al. | |
| 2010/0124813 A1 * | 5/2010 | Matamis et al. .............. | 438/478 |
| 2010/0248482 A1 | 9/2010 | Hashimoto | |
| 2011/0070713 A1 * | 3/2011 | Nansei .......................... | 438/382 |
| 2011/0233505 A1 * | 9/2011 | Nitta ................................ | 257/3 |
| 2011/0250757 A1 * | 10/2011 | Sukekawa et al. ............ | 438/703 |
| 2012/0135601 A1 * | 5/2012 | Park et al. ..................... | 438/675 |

(Continued)

FOREIGN PATENT DOCUMENTS

JP 2008-235553 A 10/2008
JP 2008-277550 A 11/2008

(Continued)

*Primary Examiner* — Jarrett Stark
*Assistant Examiner* — Bitew Dinke
(74) *Attorney, Agent, or Firm* — Oblon, Spivak, McClelland, Maier & Neustadt, L.L.P.

(57) ABSTRACT

According to one embodiment, a method for manufacturing a semiconductor device includes forming a plurality of second core films, the second core film having a first array portion, and a second array portion which is arranged so as to be spaced at a larger second space than the first space in the first direction from the first array portion, the second space being positioned above the loop portion. The method includes processing the second film to be processed below the first array portion into a second line and space pattern which includes a second line pattern extending in the second direction, and removing the second film to be processed below the second space and the loop portion of the first film to be processed, by an etching using the second spacer film as a mask.

20 Claims, 14 Drawing Sheets

(56) References Cited

U.S. PATENT DOCUMENTS

| | | | |
|---|---|---|---|
| 2013/0010520 A1* | 1/2013 | Murooka | 365/148 |
| 2013/0056884 A1* | 3/2013 | Eom | 257/782 |
| 2013/0161719 A1* | 6/2013 | Purayath et al. | 257/316 |

FOREIGN PATENT DOCUMENTS

| | | |
|---|---|---|
| JP | 2009-302143 A | 12/2009 |
| JP | 2010-56443 A | 3/2010 |
| JP | 2010-239009 A | 10/2010 |

* cited by examiner

METHOD FOR MANUFACTURING
SEMICONDUCTOR DEVICE

CROSS-REFERENCE TO RELATED
APPLICATION

This application is based upon and claims the benefit of priority from Japanese Patent Application No. 2011-204527, filed on Sep. 20, 2011; the entire contents of which are incorporated herein by reference.

FIELD

Embodiments described herein relate generally to a method for manufacturing a semiconductor device.

BACKGROUND

In conjunction with a progress of a refining of a semiconductor device, it is demanded to form a fine pattern which is equal to or less than a resolution limit of a lithography. As a method of achieving this, there has been known a so-called side wall transfer process of leaving a spacer film by forming the spacer film in both side walls extending in a longitudinal direction of a fin shaped core film formed by a lithography and thereafter removing the core film. In this case, the spacer film is formed as a loop shape which connects between both the side walls of the core film at a terminal end in the longitudinal direction of the core film, and the spacer films formed on both the side walls of the core film are shorted therebetween. Accordingly, it has been cut the loop portion of the spacer film.

BRIEF DESCRIPTION OF THE DRAWINGS

FIG. 1 is a schematic cross-sectional view of a light emitting device of an embodiment.

DETAILED DESCRIPTION

Figure 1A:
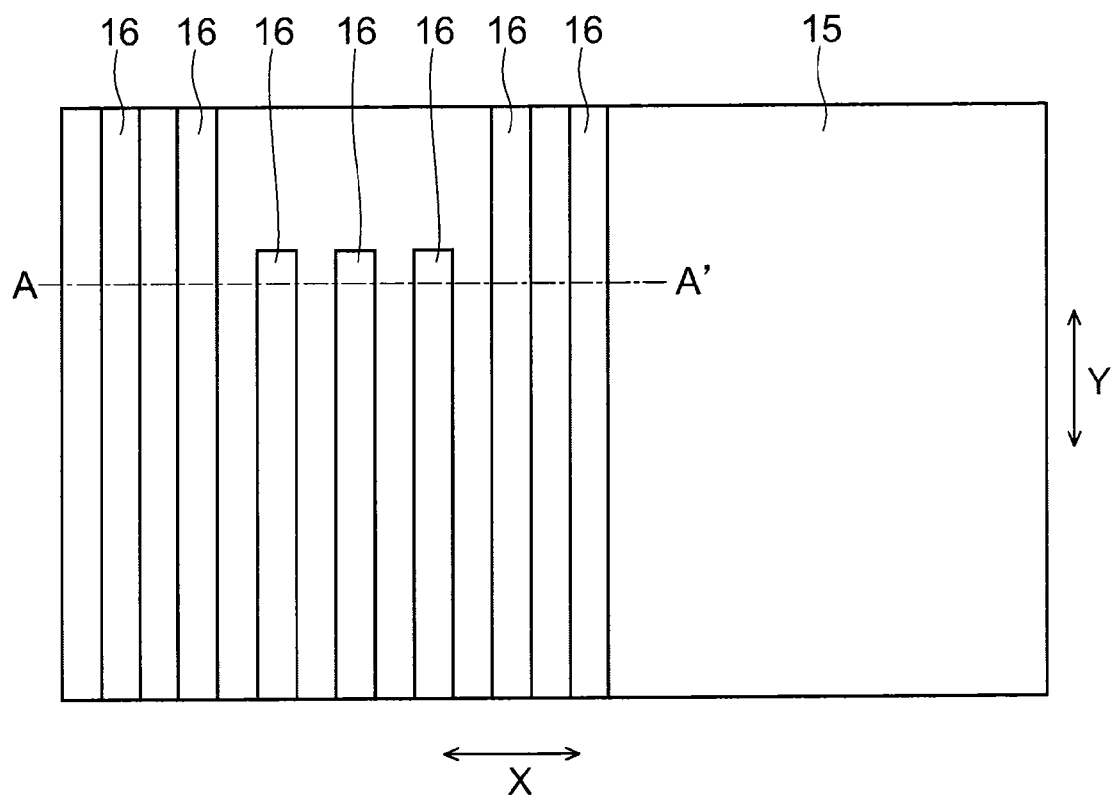
FIGS. 1A to 11C are schematic views showing a method for manufacturing a semiconductor device of an embodiment.

According to one embodiment, a method for manufacturing a semiconductor device includes forming a first core film extending in a first direction, on a first film to be processed. The method includes forming a first spacer film in a wall portion of the first core film. The method includes removing the first core film and leaving the first spacer film on the first film to be processed. The method includes processing the first film to be processed into a first line and space pattern which extends in the first direction and includes a pair of first line patterns connected at an end in the first direction via a loop portion, by an etching using the left first spacer film as a mask. The method includes forming a second film to be processed on the first line pattern and the loop portion. The method includes forming a plurality of second core films extending in a second direction intersecting the first direction, on the second film to be processed, the second core film having a first array portion which is arranged in the first direction so as to be spaced at a first space, and a second array portion which is arranged so as to be spaced at a larger second space than the first space in the first direction from the first array portion, the second space being positioned above the loop portion. The method includes forming a second spacer film in a wall portion of the second core film. The method includes removing the second core film and leaving the second spacer film on the second film to be processed. The method includes processing the second film to be processed below the first array portion into a second line and space pattern which includes a second line pattern extending in the second direction, and removing the second film to be processed below the second space and the loop portion of the first film to be processed, by an etching using the left second spacer film as a mask.

A description will be given below of an embodiment with reference to the accompanying drawings. In this case, in each of the drawings, the same reference numerals are attached to the same elements.

A in each of FIGS. 1 to 11 is a schematic plan view showing a manufacturing method of a semiconductor device in accordance with an embodiment.

B in each of FIGS. 1 to 11 corresponds to a cross section A-A' in A in each of FIGS. 1 to 11, and C in each of FIGS. 6 to 11 corresponds to a cross section B-B' in A in each of FIGS. 6 to 11.

Figure 1B:
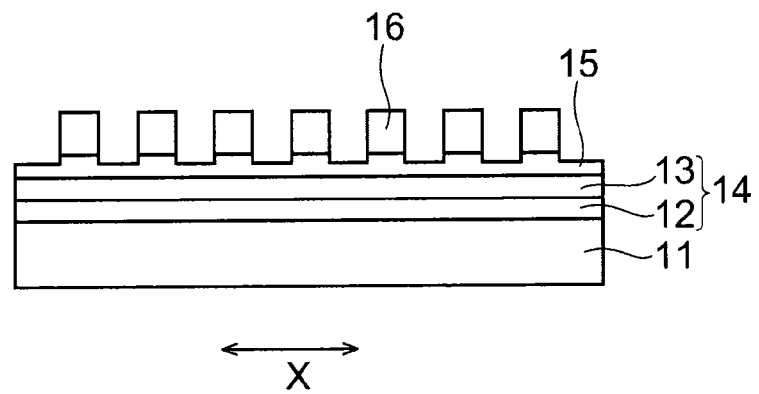

First of all, as shown in FIG. 1B, a first film to be processed 14 formed on a silicon substrate 11. The first film to be processed 14 has a stacked structure, for example, of a tungsten film 12 and a tetraethoxysilane (TEOS) film 13. The tungsten film 12, for example, having a film thickness of 100 nm is formed on the silicon substrate 11, and the TEOS film 13 having a film thickness of 100 nm is formed on the tungsten film 12.

A silicon nitride film, for example, having a film thickness of 50 nm is formed as a stopper film 15 on the TEOS film 13. The stopper film 15 serves as an etching stopper at a time of etching the film on the stopper film 15.

A first core film 16 is formed on the stopper film 15. The first core film 16 is a TEOS film, for example, having a film thickness of 200 nm.

The first core film 16 is formed on a whole surface of the stopper film 15, and a resist film which is not illustrated is formed on the first core film 16. The resist film is patterned by an exposure and a development, and the first core film 16 is selectively etched, for example, in accordance with a reactive ion etching (RIE) method by using the patterned resist film as a mask.

Accordingly, as shown in FIG. 1A, the first core film 16 is processed into a plurality of line patterns which extend in a first direction Y.

Figure 2A:
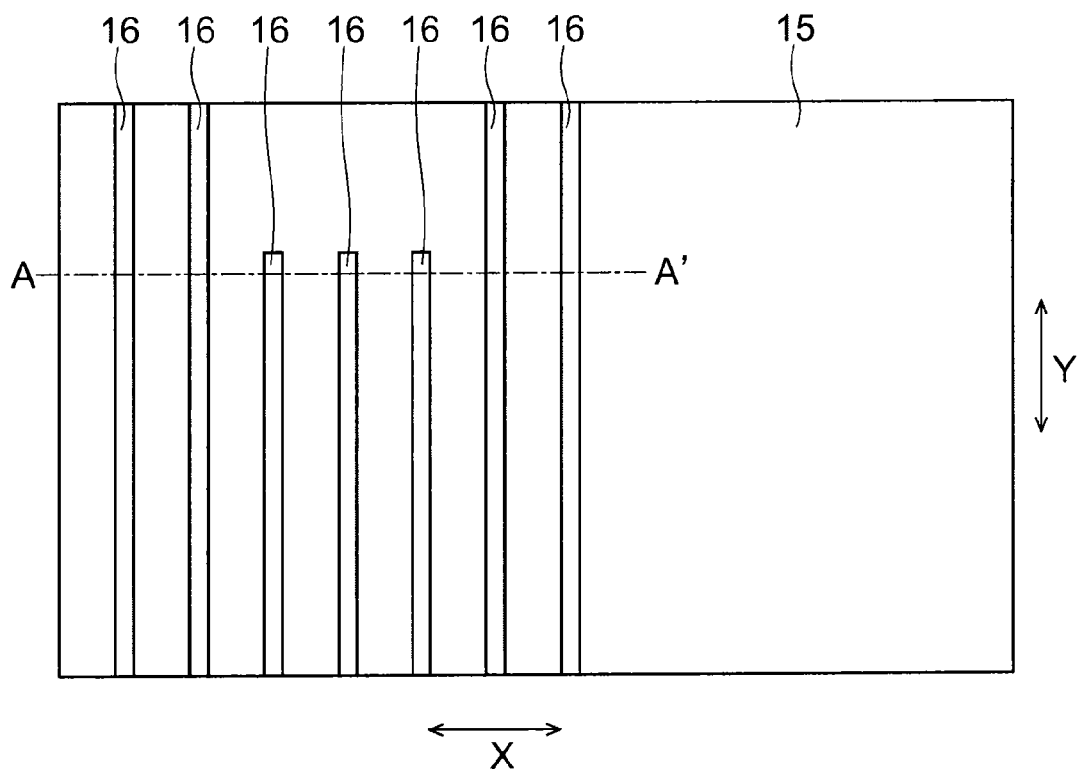
Figure 2B:
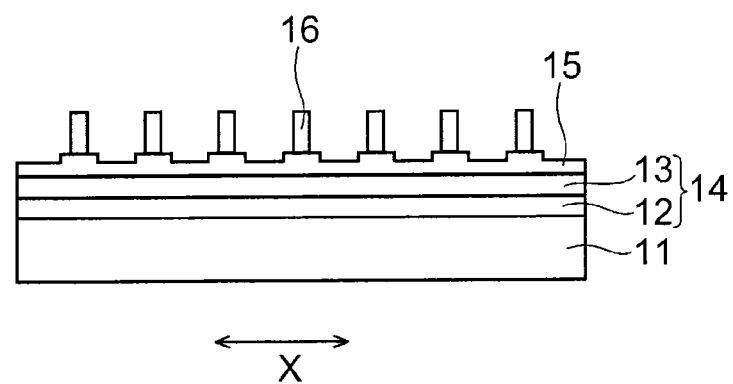

Next, for example, in accordance with a hydrofluoric acid process, as shown in FIGS. 2A and 2B, a width of the first core film 16 is reduced (slimmed).

In a state in FIGS. 1A and 1B before slimming, a width of the core film 16 and a distance between the first core films 16 (a width of a space) which are a line pattern are approximately the same, however, after slimming, the distance between the first core films 16 (the width of the space) is made about triple the width of the first core film 16.

Figure 3A:
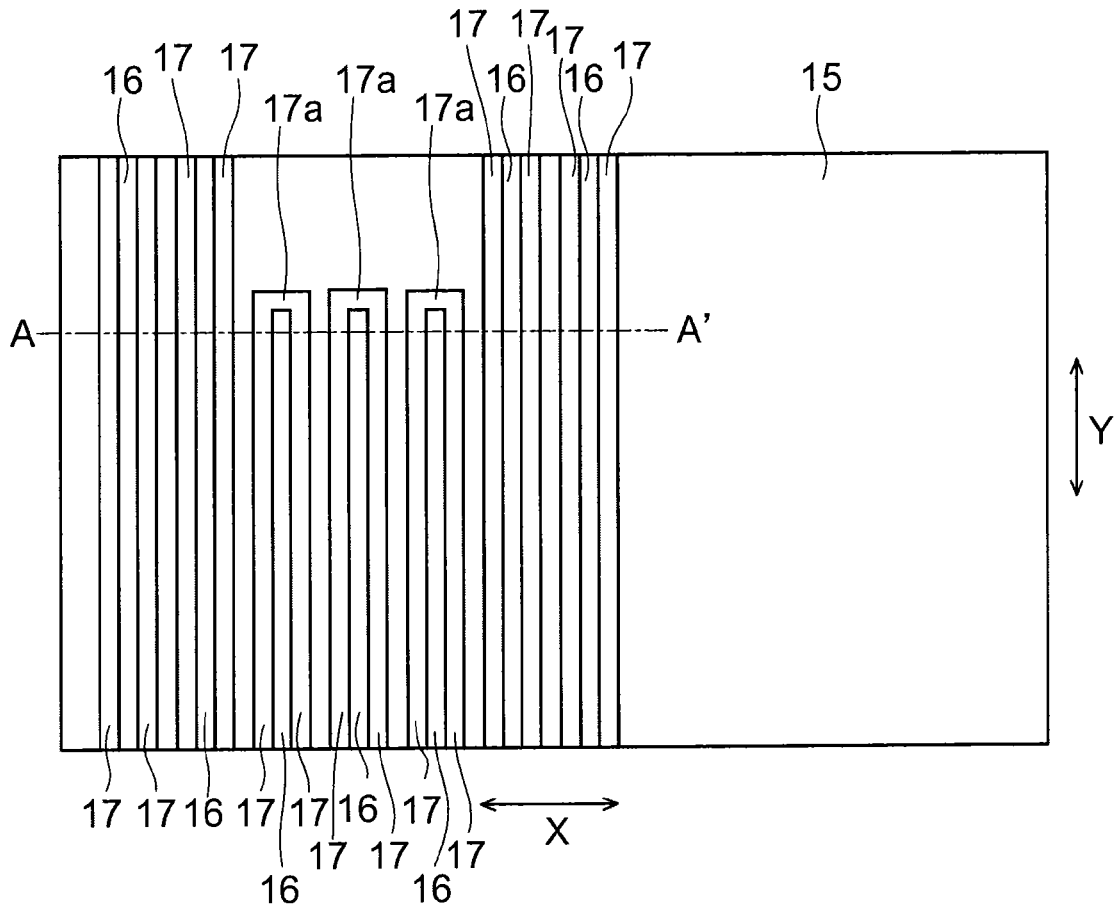
Figure 3B:
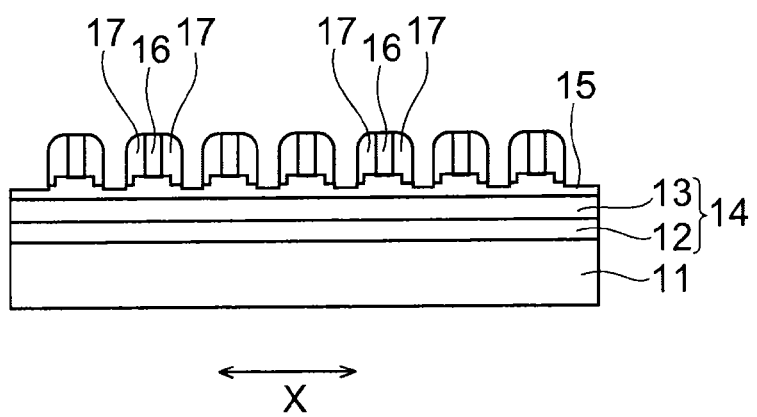

Next, as shown in FIGS. 3A and 3B, a first spacer film 17 is formed on a wall portion of the first core film 16.

For example, after an amorphous silicon film having a film thickness of 50 nm is piled up on the stopper film 15 in accordance with a low pressure chemical vapor deposition (CVD) method in such a manner as to cover in a conformal manner a top surface and a side surface of the first core film 16, it is etched back in accordance with the RIE method.

Accordingly, as shown in FIGS. 3A and 3B, the amorphous silicon film is left as a first spacer film 17 on the side wall of the first core film 16. Further, as shown in FIG. 3A, the first spacer film 17 is also formed on an end wall in a longitudinal direction (a first direction Y) in the first core film 16.

In other words, the first spacer film 17 is formed on both side walls in a width direction of the first core film 16, and is formed as a loop shape which is connected from a side wall to an end wall in an end in the longitudinal direction. In other words, in a plan view, the first spacer film 17 continuously covers a periphery of the first core film 16, and a loop portion 17a of the first spacer film 17 is formed on a terminal end of the first core film 16.

For example, the terminal ends of three first core films 16 are shown in FIG. 3A, however, the loop portion 17a of the first spacer film 17 is also formed on the terminal end of the first core film 16 at the other positions which are not illustrated.

The amorphous silicon film which is piled up on the top surface of the first core film 16 is removed, and the top surface of the first core film 16 is exposed. Further, a space is formed between the first spacer films 17 which are adjacent in the second direction X, and the stopper film 15 is exposed in a bottom portion of the space.

Figure 4A:
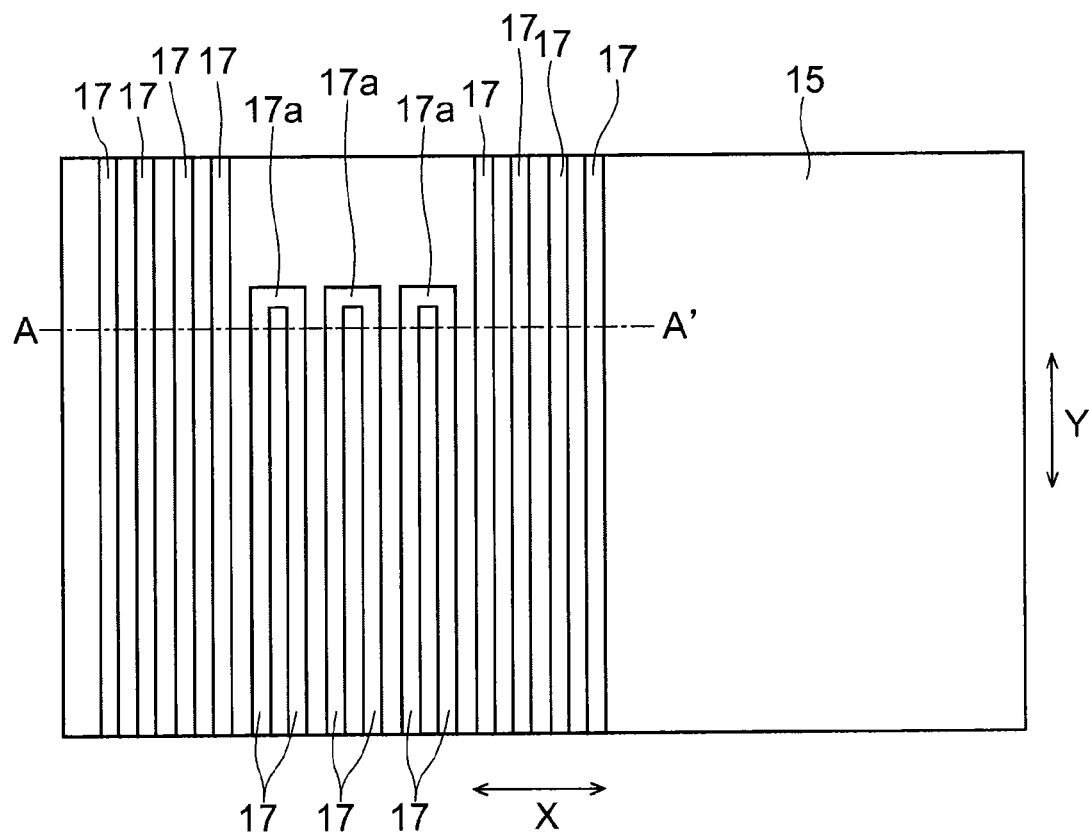
Figure 4B:
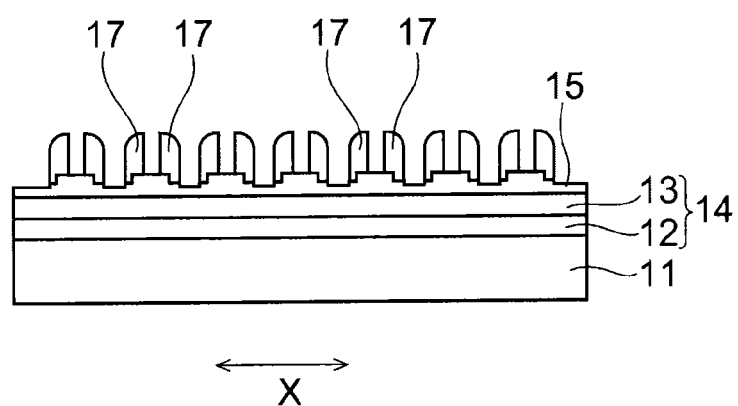

Next, the first core film 16 is removed, for example, in accordance with a hydrofluoric acid process. Accordingly, as shown in FIGS. 4A and 4B, a plurality of line-shaped first spacer films 17 extending in the first direction Y are left on the first film to be processed 14 via the stopper film 15.

Figure 5A:
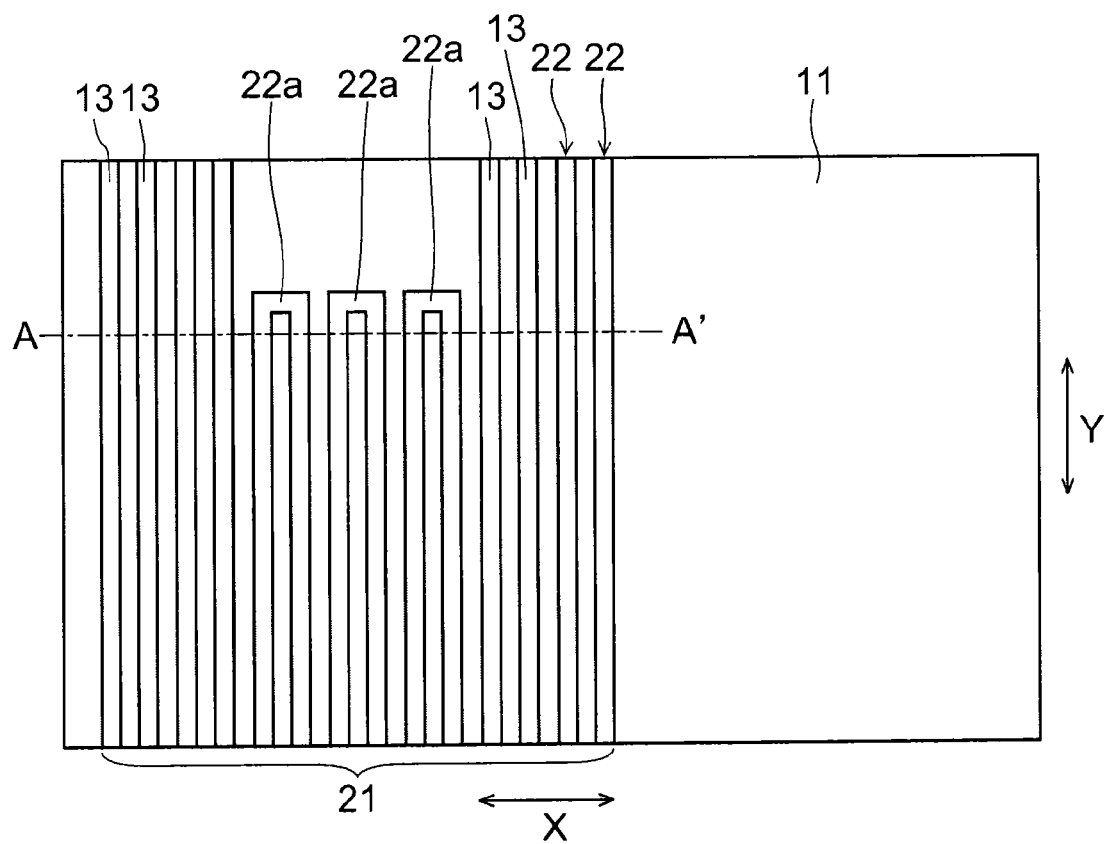
Figure 5B:
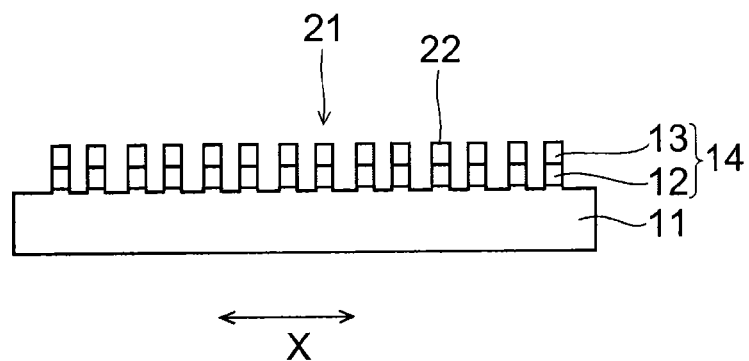

Next, a lower layer is etched by using the first spacer film 17 as a mask. For example, in accordance with the RIE method, the TEOS film 13 and the tungsten film 12 which are the first film to be processed 14 are processed into a first line and space pattern 21, as shown in FIGS. 5A and 5B.

The first line and space pattern 21 extends in the first direction Y, and includes a pair of first line patterns 22 which are connected at an end in the first direction Y via a loop portion 22a.

In accordance with the so-called side wall transfer process described above, there can be obtained the line and space pattern which is arranged at a narrower pitch than a pitch which is limited by the resolution limit of the lithography. In other words, it is possible to obtain the first line and space pattern 21 which is arranged at the narrower pitch than the pitch of the first core film 16 in FIGS. 1A and 1B which is limited by the resolution limit of the lithography.

Figure 6A:
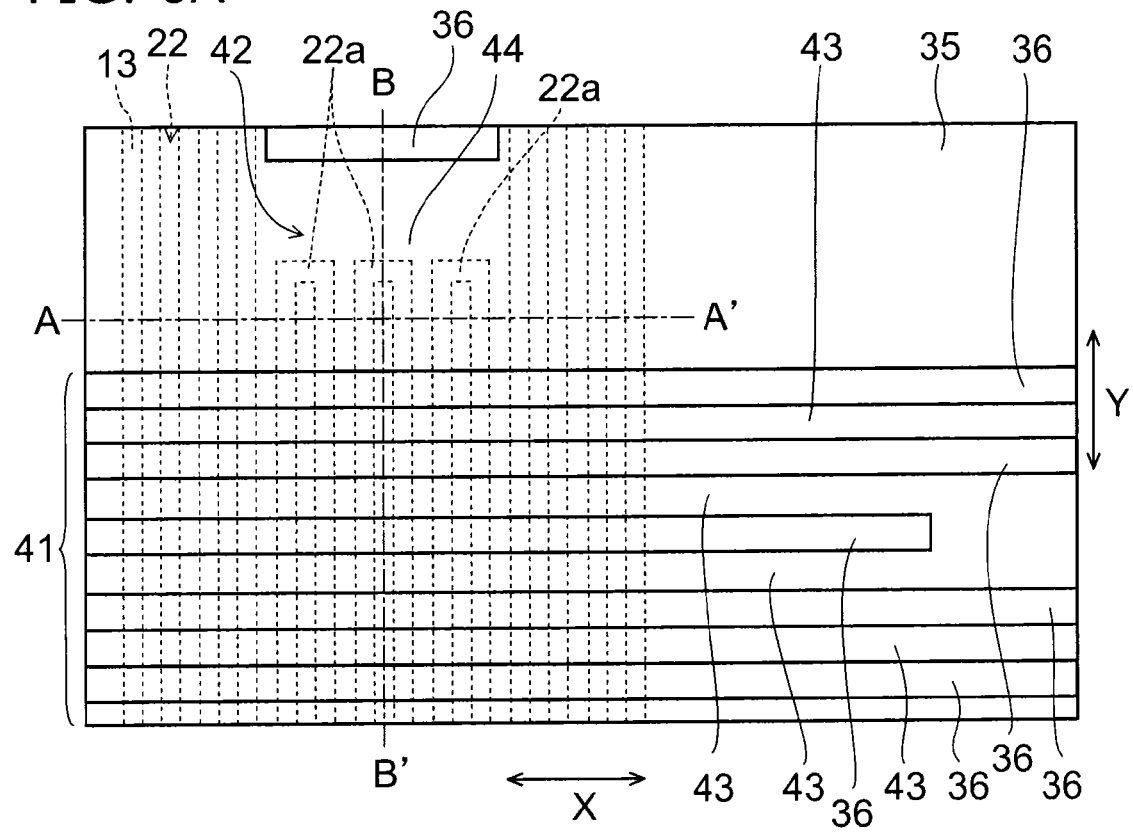
Figure 6B:
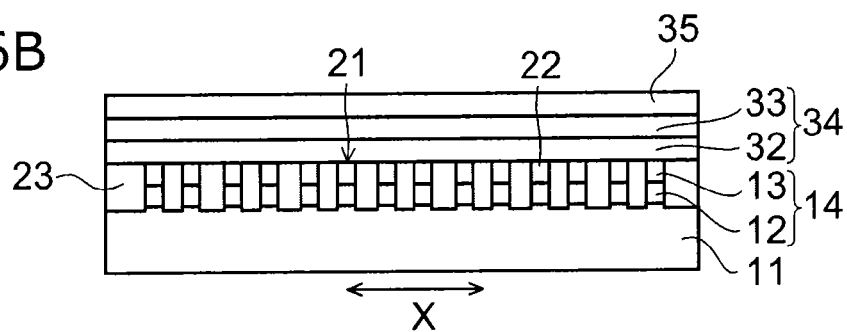
Figure 6C:
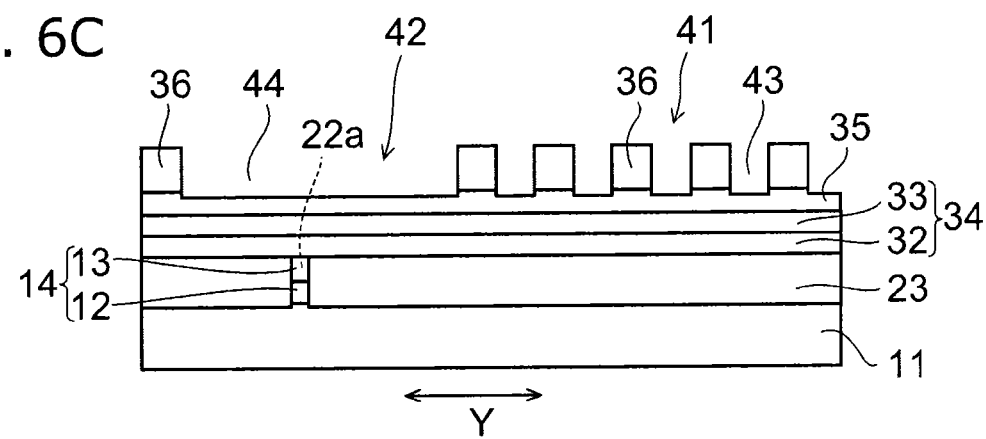

Next, the first line and space pattern 21 is embedded, for example, by a polysilazane as an embedded member 23, as shown in FIGS. 6B and 6C, the polysilazane is flattened in succession in accordance with a chemical mechanical polishing (CMP) method, and a top surface of the TEOS film 13 is exposed.

The top surface of the TEOS film 13 which is an upper layer portion of the first film to be processed 14 is made approximately flush with the top surface of the embedded member 23 which is embedded between the first films to be processed 14. A second film to be processed 34 is formed thereon.

The second film to be processed 34 has the same material and the same stacked structure as the first film to be processed 14. In other words, the second film to be processed 34 has a stacked structure between the tungsten film 32 and the TEOS film 33. For example, the tungsten film 32 having a film thickness of 100 nm is formed on the first film to be processed 14 and on the embedded member 23, and the TEOS film 33 having a film thickness of 100 nm is formed on the tungsten film 32.

Further, a silicon nitride film, for example, having a film thickness of 50 nm is formed as a stopper film 35 on the TEOS film 33. The stopper film 35 serves as an etching stopper at a time of etching the film on the stopper film 35.

Next, the TEOS film is piled up as a second core film 36 on the stopper film 35, for example, at a film thickness of 200 nm.

The second core film 36 is formed on a whole surface of the stopper film 35, and a resist film which is not illustrated is formed on the second core film 36. The resist film is patterned in accordance with an exposure and a development, and the second core film 36 is selectively etched, for example, in accordance with the RIE method, by using the patterned resist film as a mask.

Accordingly, the second core film 36 is patterned as shown in FIGS. 6A and 6C. The second core film 36 has a first array portion 41 and a second array portion 42.

In the first array portion 41, a plurality of line-shaped second core films 36 extending in the second direction X are arranged side by side in the first direction Y so as to be spaced at a first space 43. In the second array portion 42, a pair of second core films 36 are arranged side by side in the first direction Y so as to be spaced at a second space 44.

The first direction Y and the second direction X intersect within a plane shown in FIG. 6A. In the embodiment, the first direction Y and the second direction X are, for example, orthogonal.

In the example shown in FIG. 6A, one of a pair of second core films 36 which are arranged side by side in the first direction Y so as to be spaced at the second space 44 is the second core film 36 at the end of the first array portion 41, and another is the second core film 36 which is designed on the basis of different shape and size from the second core film 36 of the first array portion 41. Alternatively, another of a pair of second core films 36 which are arranged side by side in the first direction Y so as to be spaced at the second space 44 may be a line pattern having the same width as the second core film 36 of the first array portion 41.

The second space portion 44 is larger in the size in the first direction Y than the first space 43. In other words, in the first array portion 41, the second core films 36 are arranged side by side in the first direction Y more densely than the second array portion 42.

In FIG. 6A, the loop portion 22a in which a pair of first films to be processed 14 mentioned above are connected at the end in the first direction Y is shown by a broken line. The second space 44 is positioned on the loop portion 22a.

Figure 7A:
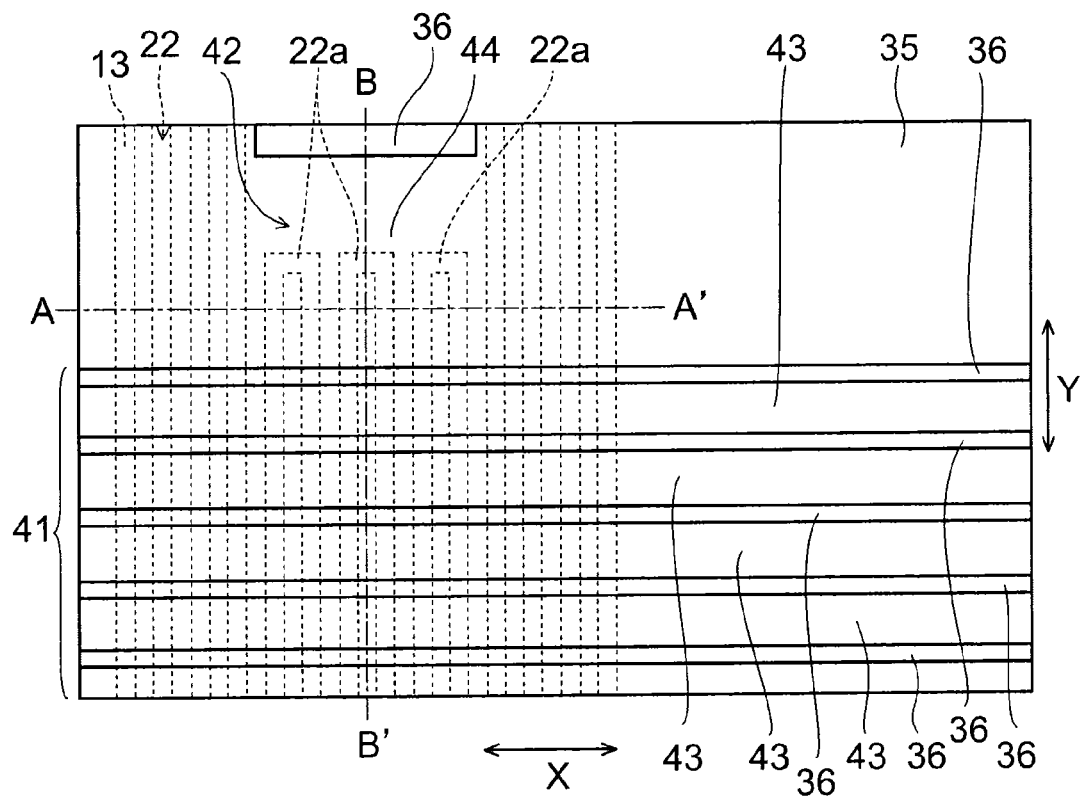
Figure 7B:
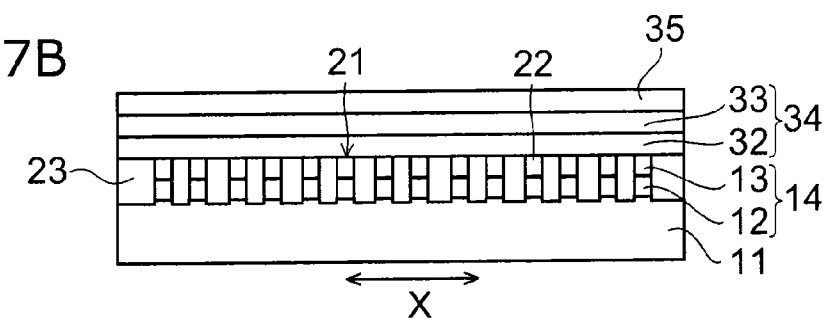
Figure 7C:
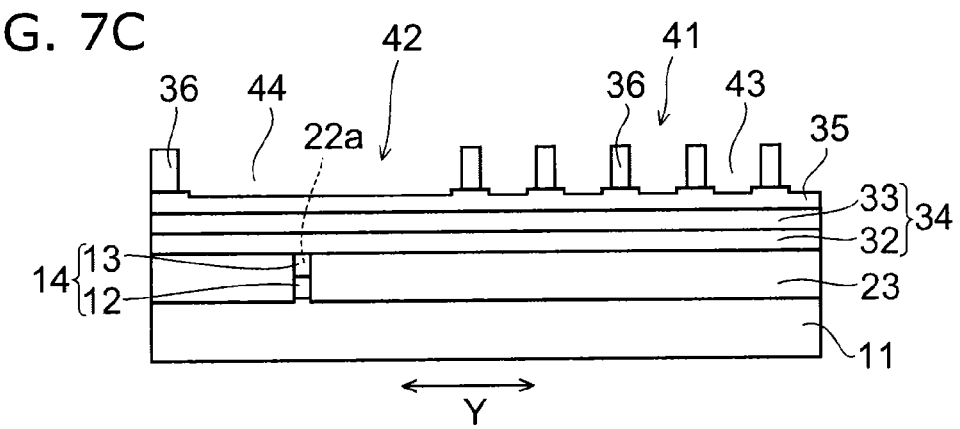

Next, the width of the second core film 36 is reduced (slimmed), for example, in accordance with the hydrofluoric acid process, as shown in FIGS. 7A and 7C.

In a state of FIGS. 6A and 6C before slimming, the width of the second core film 36 in the first array portion 41 is approximately the same as the distance between the second core films 36 (the width of the space), however, after slimming, the distance between the second core films 36 in the first array portion 41 (the width of the space) became about triple the width of the second core film 36.

Figure 8A:
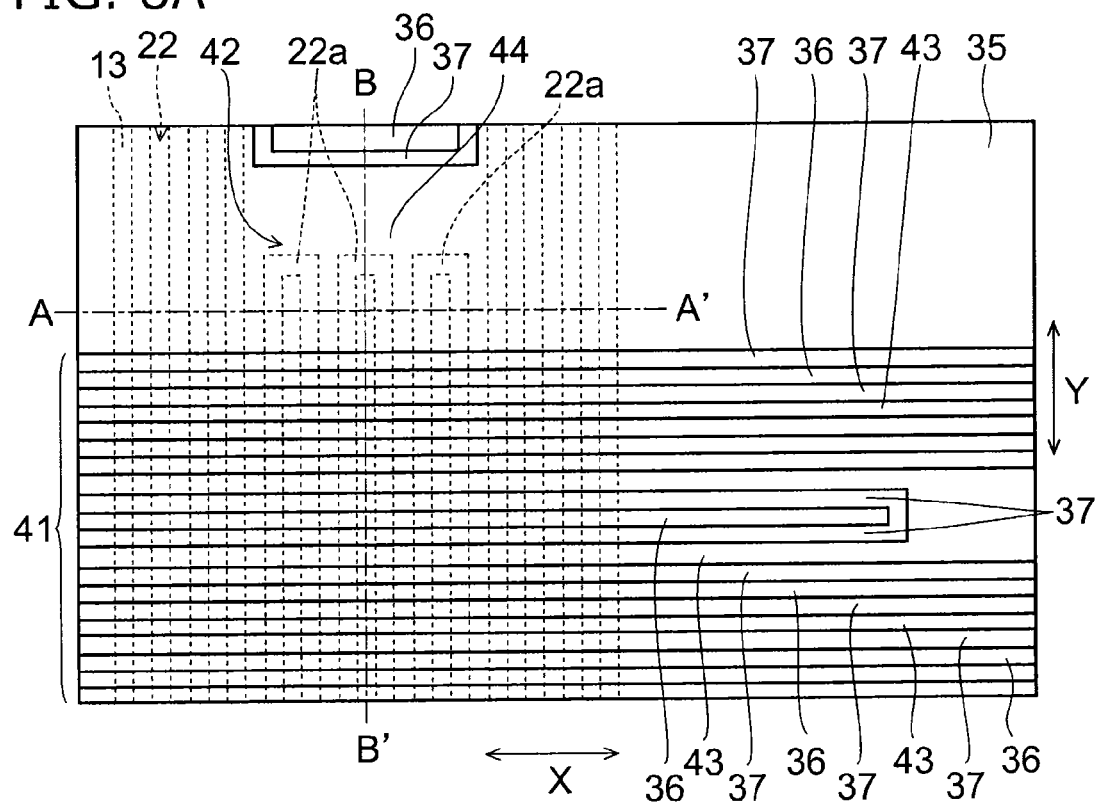
Figure 8B:
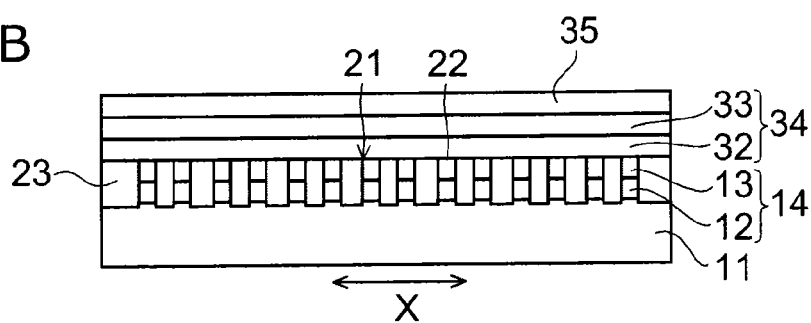
Figure 8C:
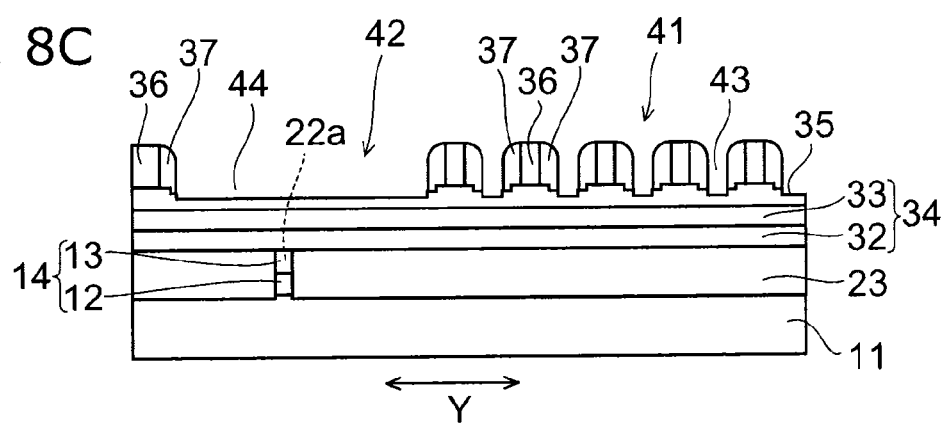

Next, as shown in FIGS. 8A and 8C, the second spacer film 37 is formed on a wall portion of the second core film 36.

After the amorphous silicon film having the film thickness of 50 nm is piled up on the stopper film 35, for example, in accordance with the low pressure CVD method, in such a manner as to cover the top surface and the side surface of the second core film 36 in a conformal manner, it is etched back in accordance with the RIE method.

Accordingly, as shown in FIGS. 8A and 8C, the amorphous silicon film is left as the second spacer film 37 in the side wall of the second core film 36. Further, at this time, as shown in FIG. 8A, the second spacer film 37 is formed as a loop shape in an end wall in the longitudinal direction (the second direction X) in the second core film 36. In a plan view, the second spacer film 37 continuously covers the periphery of the second core film 36.

The amorphous silicon film which is piled up on the top surface of the second core film 36 is removed, and the top surface of the second core film 36 is exposed. Further, the stopper film 35 is exposed to a bottom portion of the first space 43 between the spaced films 37 which are adjacent in the first direction Y in the first array portion 41.

The second spacer film 37 is also formed on opposite side walls of a pair of second core films 36 which are positioned so as to be spaced at the second space 44 in the second array portion 42, and the stopper film 35 is exposed to the bottom portion of the second space 44 between the second spacer films 37.

Figure 9A:
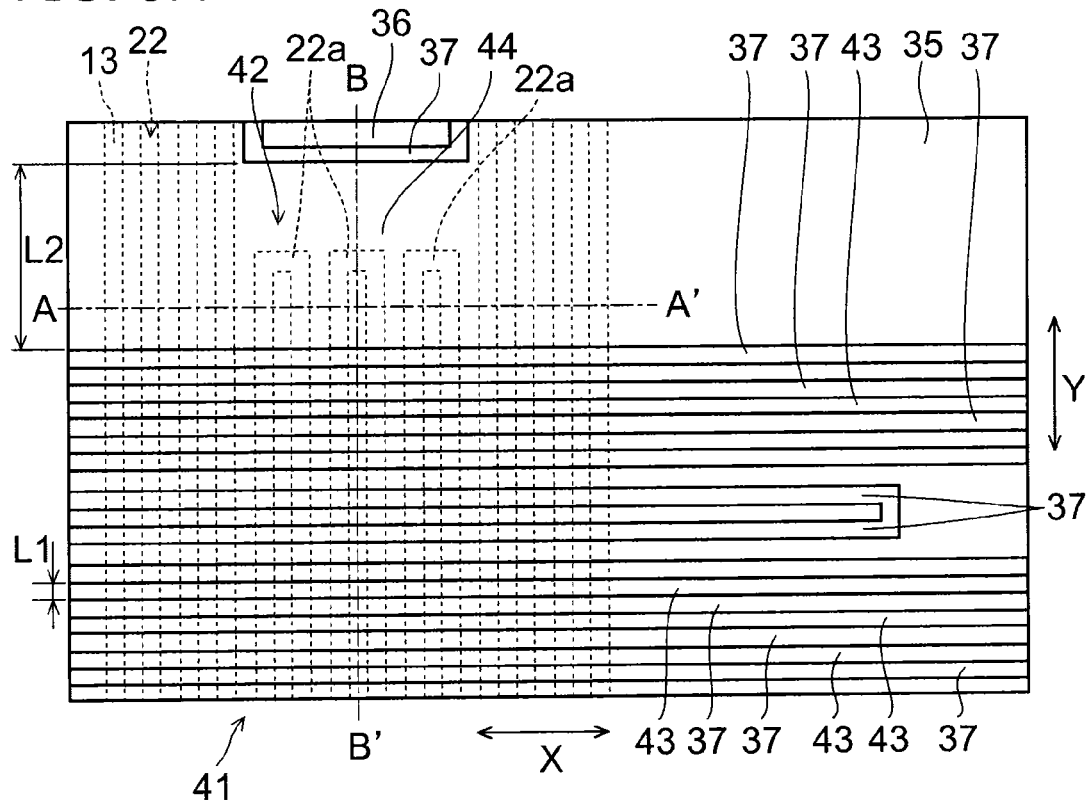
Figure 9B:
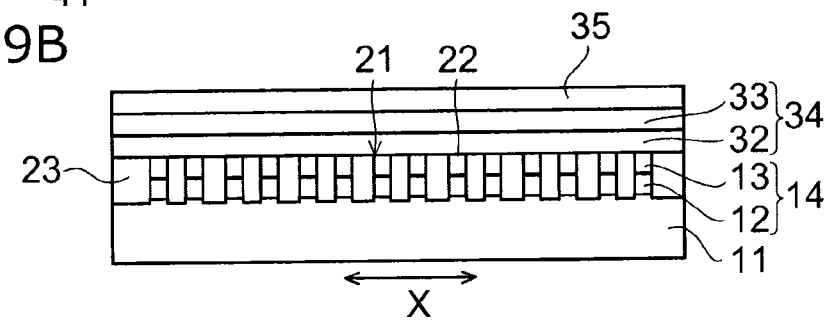
Figure 9C:
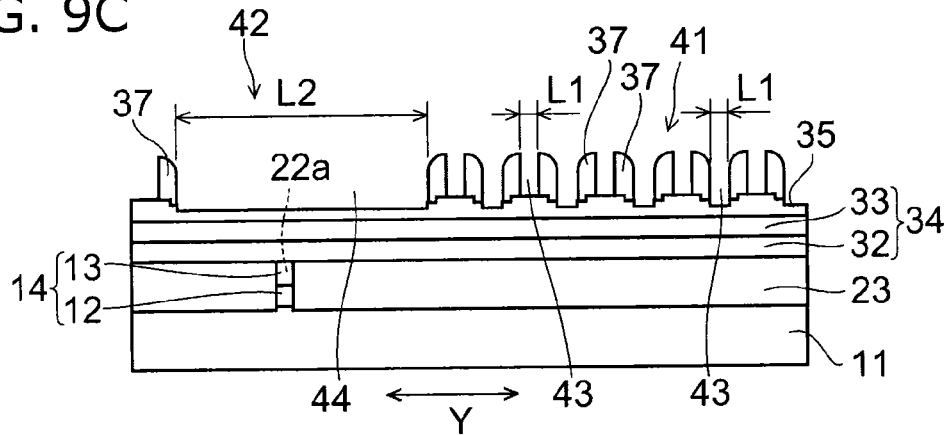

Next, the second core film 36 is removed, for example, in accordance with the hydrofluoric acid process. Accordingly, as shown in FIGS. 9A and 9C, the second spacer film 37 is left on the second film to be processed 34 via the stopper film 35.

In the first array portion 41, there are left a plurality of line-shaped second spacer films 37 which extend in the second direction X. In the first array portion 41, a plurality of line-shaped second spacer films 37 are arranged side by side in the first direction Y so as to be spaced at the first space 43 which is approximately the same distance.

In this case, a width in the first direction Y of the first space 43 is set to L1. Further, a width in the first direction Y of the second space 44 in the second array portion 42 is set to L2. L2 is larger than L1.

Figure 10A:
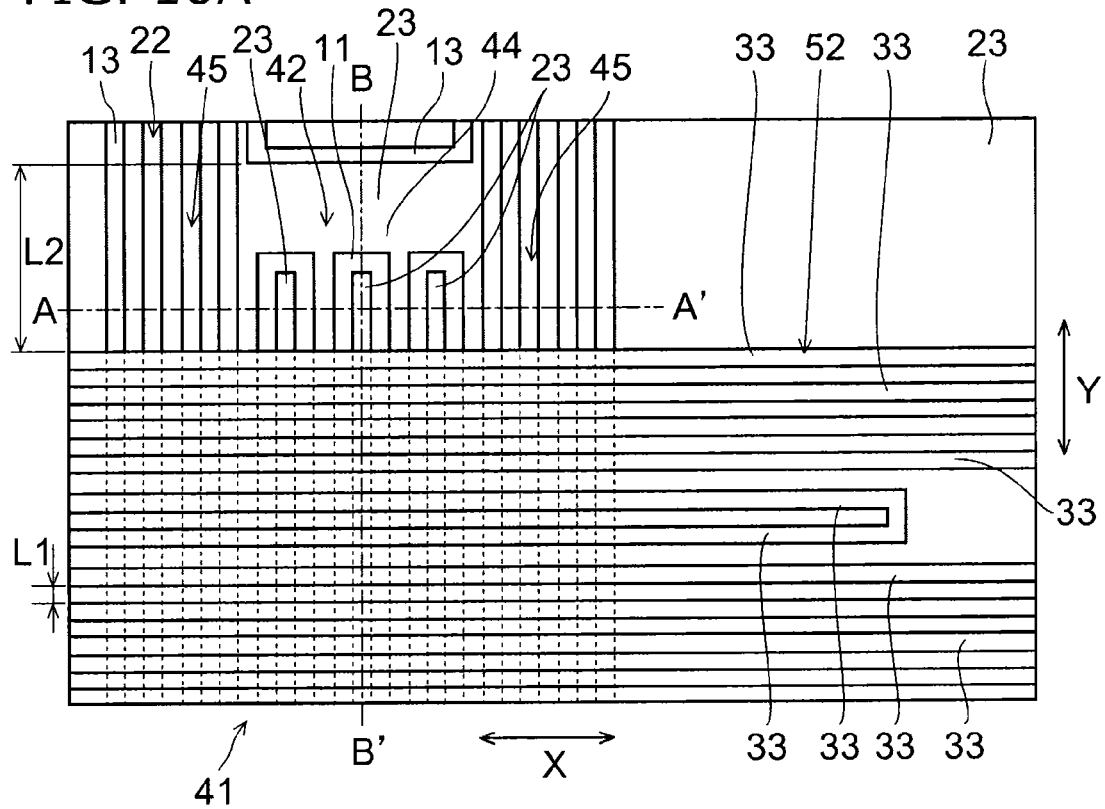
Figure 10B:
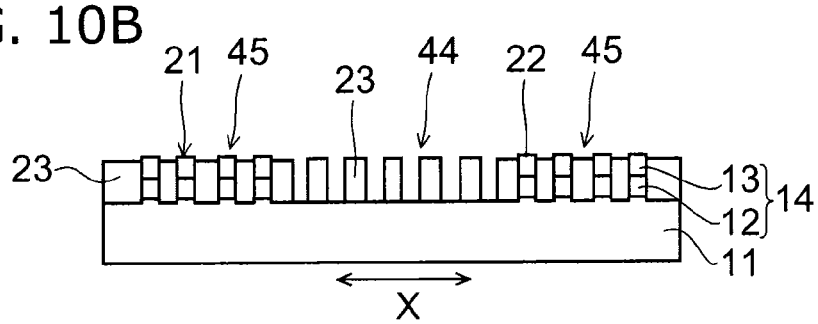
Figure 10C:
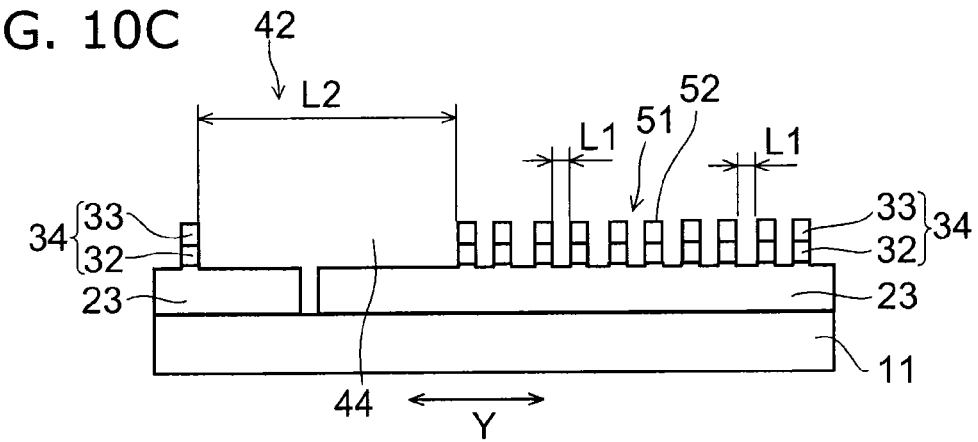

Next, the lower layer is etched by setting the second spacer film 37 to the mask. For example, in accordance with the RIE method, the TEOS film 33 and the tungsten film 32 which are the second film to be processed 34 are processed into a second line and space pattern 51 as shown in FIGS. 10A and 10C.

In the RIE, on the basis of a so-called micro loading effect, there is generated a phenomenon that an etching rate is lowered in conjunction with a reduction of a mask opening width, that is, a width of an etched zone. This is caused by the fact that an ion is hard to reach a bottom of a groove or a hole having a high aspect ratio (a ratio of a depth with respect to the width).

Figure 12:
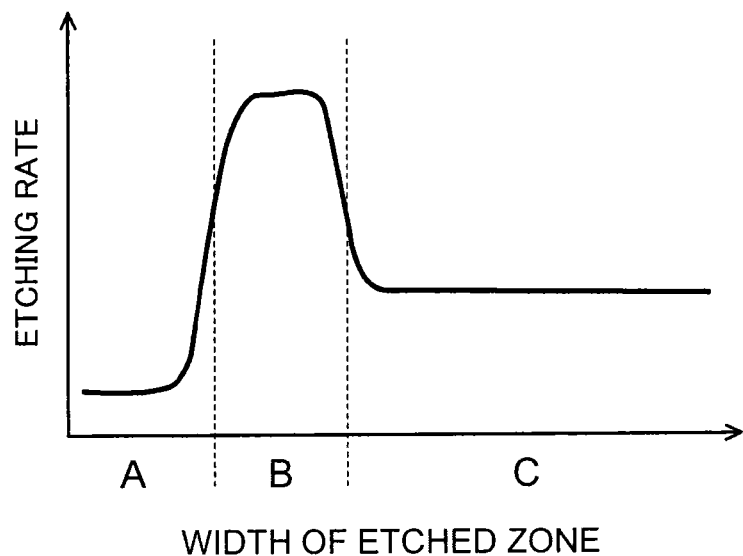
FIG. 12 is a view showing a relationship between the etching rate and the width of the etched zone.

Further, the inventor has found that a high etching rate can be obtained in the case that the width of the etched zone (the space in the case of etching while leaving the line) is in a particular range (a range B in FIG. 12).

FIG. 12 shows a relationship between the etching rate and the width of the etched zone. A horizontal axis indicates the width of the etched zone, and the width becomes larger in the order of the ranges A, B and C. A vertical axis indicates the etching rate.

The range A is, for example, larger than 0 nm and equal to or less than 50 nm. The range B is, for example, larger than 50 nm and less than 100 nm. The range C has a larger width than the range B, and is, for example, equal to or more than 100 nm.

As the width here, the width in the first direction Y in FIGS. 9A and 9C is assumed. In the case that the width in the first direction Y of the etched zone is in the range B, the etching rate becomes higher in the case that the width is in the range A or the range C. The etching rate in the case that the width is in the range C is higher than the etching rate in the case that the width is in the range A.

Further, in the embodiment, the width L1 in the first direction Y of the first space 43 between the adjacent second spacer films 37 in the first array portion 41 is set within the range A, and the width L2 in the first direction Y of the second space 44 in the second array portion 42 is set within the range B.

Accordingly, in the case that the RIE is applied to the first array portion 41 and the second array portion 42 simultaneously while setting the second spacer film 37 to the mask, the etching rate of the second film to be processed 34 and the first film to be processed 14 below the second space 44 is higher than the etching rate of the second film to be processed 34 below the first array portion 41.

Further, at a time of the RIE, the etching rate of the second film to be processed 34 and the first film to be processed 14 below the second space 44 is higher than the etching rate of the second film to be processed 34 and the first film to be processed 14 below the third space which has the larger size in the first direction Y than the second space 44 and is within the range C.

Accordingly, the etching is promoted below the second space 44 than in the other zones. In other words, the second film to be processed 34 is only removed below the first space 43, however, below the second space 44, the second film to be processed 34 is removed and the first film to be processed 14 below it is also removed. Since the loop portion 22a of the first film to be processed 14 is formed below the second space 44, the loop portion 22a is removed by the RIE mentioned above.

The second film to be processed 34 and the first film to be processed 14 have the same stacked structure of the same material, and are continuously etched within the same chamber. Conditions such as a gas kind, a gas introduction amount, an applied power and the like are changed between the time of etching the TEOS films 33 and 13 and the time of etching the tungsten films 32 and 12, however, the chamber is not open to the atmospheric air, but the second film to be processed 34 and the first film to be processed 14 are continuously etched while the wafer to be processed is accommodated in the same chamber under the reduced pressure.

In accordance with the RIE mentioned above, as shown in FIGS. 10A to 10C, the second film to be processed 34 below the first array portion 41 is processed into the second line and space pattern 51 including a plurality of second line patterns 52 which extend in the second direction X, and the second film to be processed 34 below the second space 44, and the loop portion 22a of the first film to be processed 14 are removed.

In other words, the loop portion of the spacer film which is generated by carrying out the side wall transfer process can be removed simultaneously at the etching time of processing the line and space pattern which is formed on the upper layer thereof. As a result, it is possible to widely reduce the process number.

In the first direction Y in the zones 45 in both sides of the second space 44 as seen in the second direction X, a space in which the second spacer film 37 does not exist spreads at a width corresponding to the range C mentioned above. Accordingly, the etching rate of the second film to be processed 34 and the first film to be processed 14 in the zone 45 is lower than the etching rate of the second film to be processed 34 and the first film to be processed 14 below the second space 44 which is set in the width within the range B. Accordingly, the second film to be processed 34 is only etched in the zone 45, and the first film to be processed 14 is left as shown in FIG. 10B.

In other words, it is possible to selectively remove the first film to be processed 14 below the second space 44 including the loop portion 22a by appropriately setting the width L1 of the first space 43 between the adjacent second spacer films 37 in the first array portion 41, the width L2 in the first direction Y of the second space 44 in the second array portion 42, and the width in the second direction X of the second space 44. The first film to be processed 14 below the other zones than the second space 44 is left as the first line and space pattern 21.

Since the second line and space pattern 51 formed on the upper layer of the first line and space pattern 21 is formed by the side wall transfer process as mentioned above, there can be obtained a line and space pattern which is arranged at a narrower pitch than a pitch which is limited by the resolution limit of the lithography. In other words, there can be obtained the second line and space pattern 51 which is arranged at the narrower pitch than the pitch of the second core film 36 in FIGS. 6A and 6C which is limited by the resolution limit of the lithography.

In accordance with the process described above, there can be obtained a structure in which the first line and space pattern 21 and the second line and space 51 three-dimensionally intersect. In other words, the process in accordance with the embodiment can be applied, for example, to a manufacturing of a resistance change type memory having a three-dimensional cross point structure which is described below.

Figure 15A:
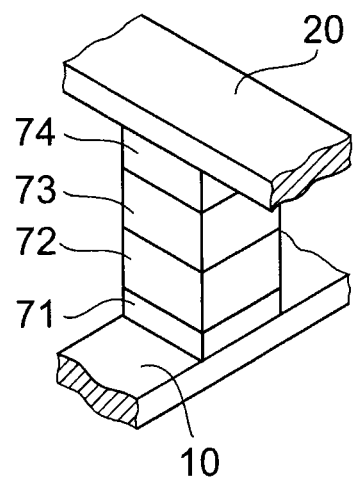
FIGS. 15A and 15B are schematic perspective views of a part of the semiconductor device of the embodiment.

A stacked structure, for example, including a variable resistance film 73 and a diode 72 shown in FIG. 15A is formed on a portion in which the first line pattern 22 in the first line and space pattern 21 intersects the second line pattern 52 in the second line and space pattern 51.

A first interconnection 10 in FIG. 15A corresponds to the tungsten film 12 in the first line pattern 22, and a second interconnection 20 corresponds to the tungsten film 32 in the second line pattern 52.

A plurality of stacked structures which are provided in the first interconnection 10, the second interconnection 20 and the cross point of them are arranged in a two-dimensional direction, and they are stacked in plural layers. The first interconnection 10 and the second interconnection 20 in FIG. 15A respectively correspond to a word line WL and a bit line BL in FIG. 15B. Alternatively, the first interconnection 10 corresponds to the bit line BL and the second interconnection 20 corresponds to the word line WL. The number and the stack number of the word line WL and the bit line BL are optional.

The stacked structure which is provided in the cross point of the first interconnection 10 and the second interconnection 20 has a structure in which a variable resistance film 73 corresponding to a memory layer and a diode 72 corresponding to a rectifying element are connected in series between the first interconnection 10 and the second interconnection 20.

The diode 72 is provided on the first interconnection 10 via a lower electrode 71. The variable resistance film 73 is provided on the diode 72, and the second interconnection 20 is formed on the variable resistance film 73 via an upper electrode 74.

This semiconductor device is a nonvolatile memory device. It is possible to change a resistance value of the variable resistance film 73 by applying an electric voltage to the variable resistance film 73 via the first interconnection 10 and the second interconnection 20, and even if the application of the electric voltage is thereafter stopped, it is possible to stably maintain any one of a relatively high resistance state and a relatively low resistance state. Each of the states corresponds to the data "0" or "1".

By applying a set voltage to the variable resistance film 73 in an off state in which a resistance is high and a flowing current is small, it is possible to change to an on state (a set state) in which the resistance is low and the flowing current is large. The off state (a reset state) can be achieved by applying a reset voltage to the variable resistance film 73 in the on state.

In the structure in which the first interconnections 10, the variable resistance films 73 and the second interconnections 20 are stacked in plural layers, a reverse direction bias may be applied to an unselected cell at a time of carrying out a writing on a selected cell to be written, however, an erroneous set and an erroneous reset of the unselected cell can be prevented by the diode 72 having a rectifying property.

Figure 11A:
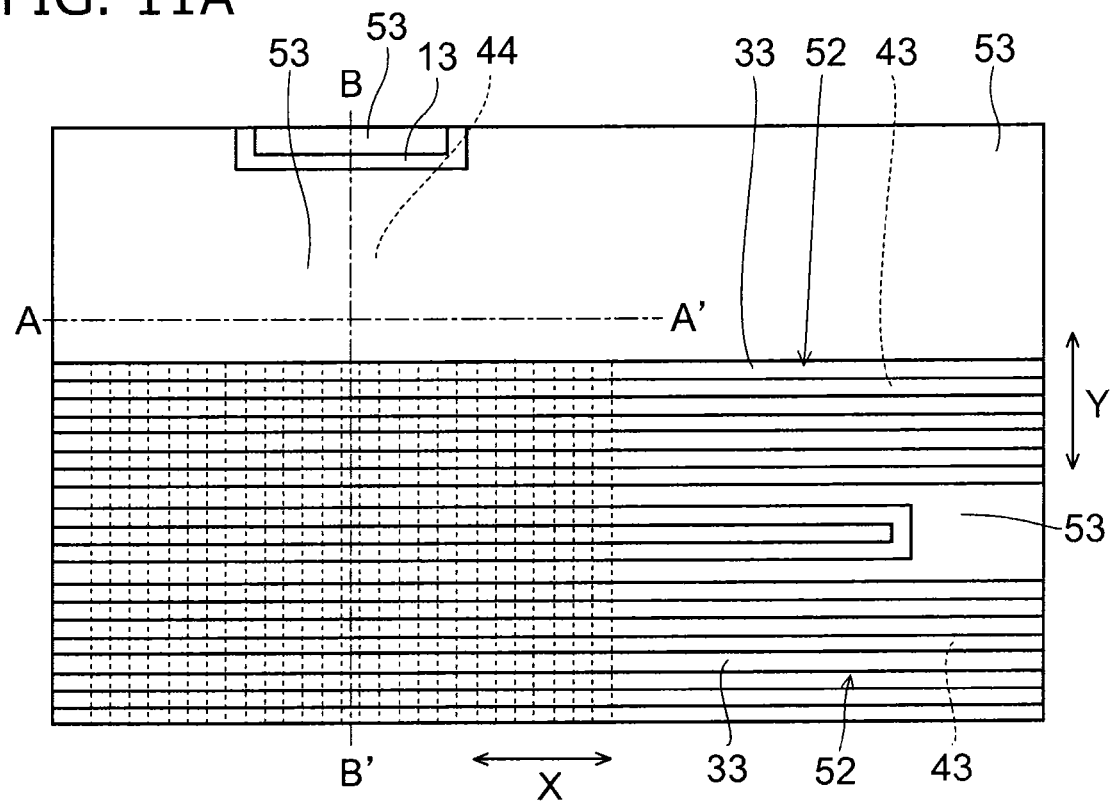
Figure 11B:
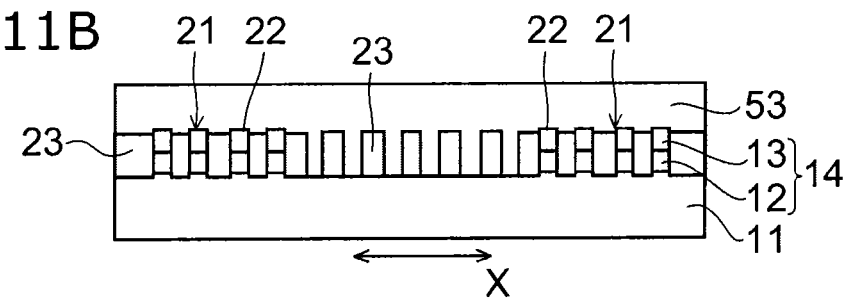
Figure 11C:
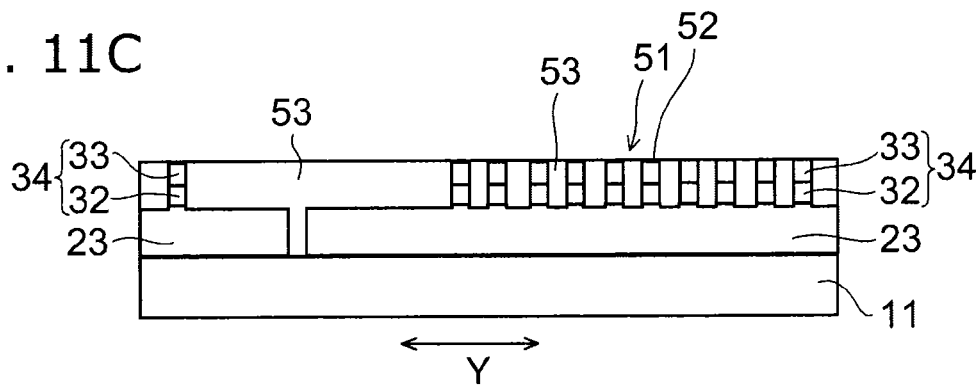

After the process in FIGS. 10A to 10C, the second line and space pattern 51 is embedded as an embedded member 53, for example, by a polysilazane, as shown in FIGS. 11A to 11C, the polysilazane is in succession flattened in accordance with the CMP method, and the top surface of the TEOS film 33 corresponding to an upper layer portion of the second film to be processed 34 is exposed.

Further, since the first film to be processed 14 is removed by the RIE mentioned above, the embedded member 53 is embedded also in the space which is formed on the embedded member 23 in the lower layer.

It is possible to obtain a structure in which the three-dimensionally intersecting line and space patterns are stacked in the plural layers, by repeating the processed mentioned above as occasion demands after flattening the top surface of the embedded member 53.

Figure 15B:
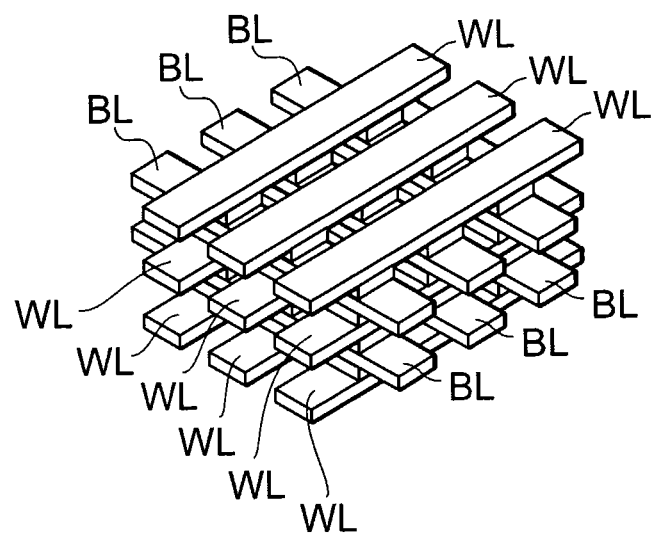

In accordance with the embodiment, in the case of forming the three-dimensional stacked memory structure as shown in FIGS. 15A and 15B by utilizing the side wall transfer process, it is possible to carry out the removal of the loop portion which is formed on the terminal end of the line pattern in the lower layer simultaneously at a time of processing the processed film in the upper layer into the line and space. In other words, in accordance with the embodiment, in the structure of the three-dimensional stacked memory structure including the process of stacking a plurality of line and space patterns, it is possible to achieve a wide reduction of the process number.

Figure 13:
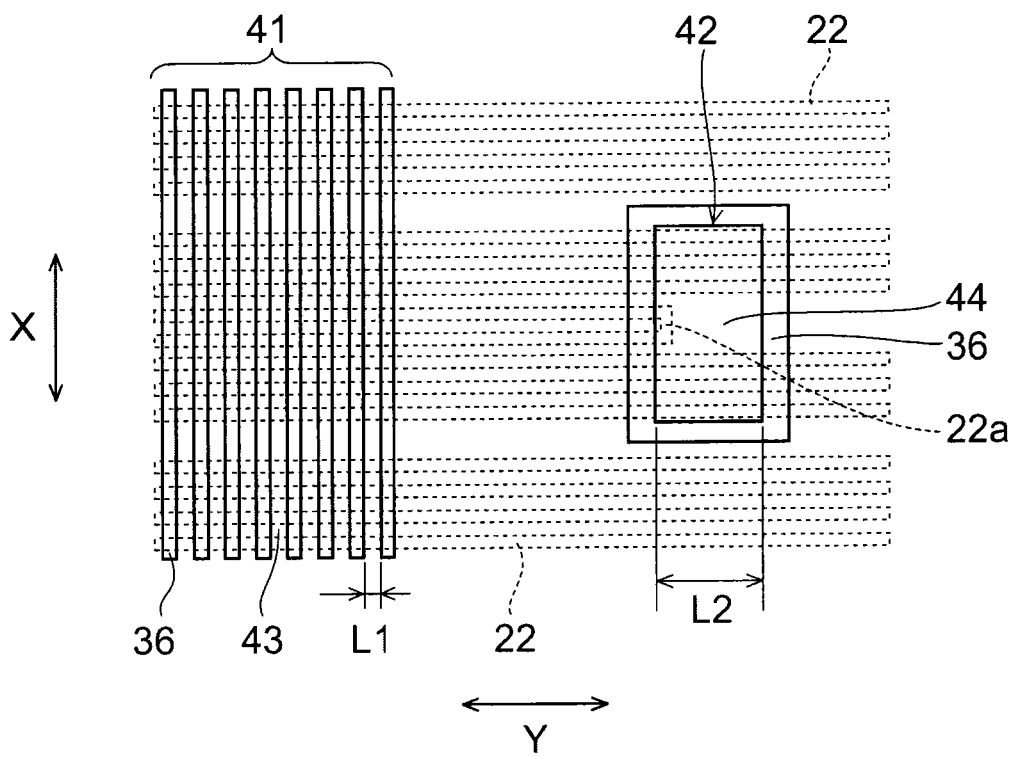
FIG. 13 is a schematic plan view showing another pattern example of a second core film.

FIG. 13 is a schematic plan view showing the other pattern example of the second core film 36, and corresponds to a plan view of FIG. 6A or FIG. 7A.

The second array portion 42 of the second core film 36 is formed by a closed loop shaped plane pattern, and the loop portion 22a of the first line pattern 22 of the first film to be processed 14 is positioned below the second space 44 in an inner side within the closed loop. The width L2 in the first direction Y in the second space 44 is set within the range B mentioned above.

In the case that the distance in the first direction Y from the second core film 36 in the end close to the loop portion 22a in the first array portion 41 to the loop portion 22a is larger than the range B, the layout in FIG. 13 can be employed.

Figure 14:
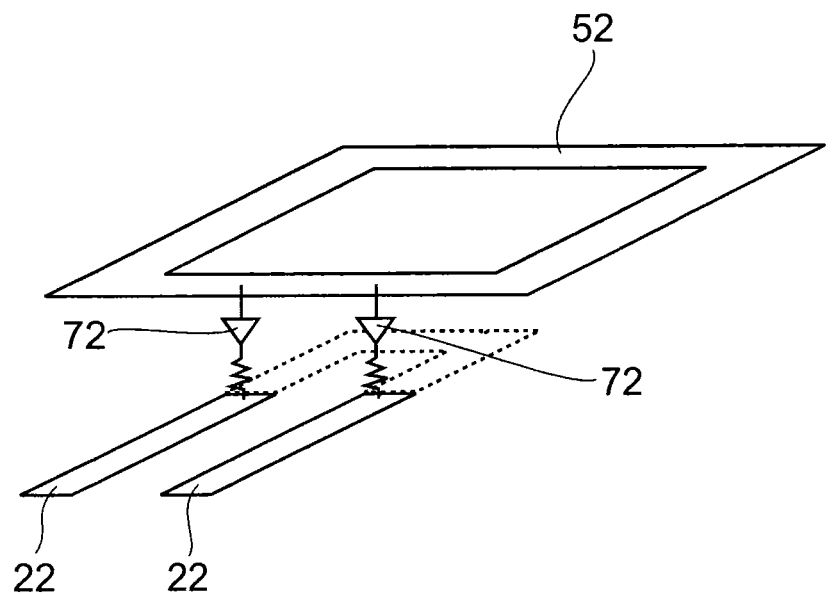
FIG. 14 is a schematic perspective view of a structure obtained by the pattern example of FIG. 13.

In accordance with the RIE in which the second core film 36 is set to the mask, the closed loop shaped pattern 52 can be formed below the closed loop shaped second array portion 42. Since the diode 72 shown in FIG. 15A is interposed between the first line pattern 22 in the lower layer and the pattern 52 in the upper layer, the first line patterns 22 are not shorted therebetween via the closed loop shaped pattern 52 in the upper layer, as schematically shown in FIG. 14.

In the side wall transfer process, the loop portion of the spacer film is formed also in the terminal end of the other core film which does not appear in the drawings mentioned above. The same processes as the processes mentioned above are applied to the loop portions, and the loops are cut simultaneously at a time of processing the upper layer.

The pattern shape of the first core film 16 is not limited to the shape shown in FIG. 1A, but may be curved partly, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A method for manufacturing a semiconductor device comprising:
    forming a first core film extending in a first direction, on a first film to be processed;
    forming a first spacer film on a wall portion of the first core film;
    removing the first core film and leaving the first spacer film on the first film to be processed;
    processing the first film to be processed into a first line and space pattern which extends in the first direction and includes a pair of first line patterns connected at an end in the first direction via a loop portion, by an etching using the first spacer film as a mask;
    forming a second film to be processed on the first line pattern and the loop portion;
    forming a plurality of second core films extending in a second direction intersecting the first direction, on the second film to be processed, the second core film having a first array portion which is arranged in the first direction so as to be spaced at a first space, and a second array portion which is arranged so as to be spaced at a second space larger than the first space in the first direction from the first array portion, the second space being positioned above the loop portion;
    forming a second spacer film on a wall portion of the second core film;
    removing the second core film and leaving the second spacer film on the second film to be processed; and
    processing the second film to be processed below the first array portion into a second line and space pattern which includes a second line pattern extending in the second direction without removing the first film below a space between the second spacer film, and removing the second film to be processed below the second space and the loop portion of the first film to be processed at the same time of processing the second film, by an etching using the second spacer film as a mask.

2. The method according to claim 1, wherein the first film to be processed and the second film to be processed are made of a same material.

3. The method according to claim 2, wherein the second film to be processed and the first film to be processed below the second space are continuously etched by a reactive ion etching (RIE) method.

4. The method according to claim 1, wherein an etching rate of the second film to be processed and the first film to be processed below the second space is higher than an etching rate of the second film to be processed below the first space, at a time of the etching using the second spacer film as the mask.

5. The method according to claim 1, wherein an etching rate of the second film to be processed and the first film to be processed below the second space is higher than an etching rate of the second film to be processed and the first film to be processed below a third space in which a size in the second direction is larger than the second space, at a time of the etching using the second spacer film as the mask.

6. The method according to claim 1, wherein the forming of the first core film has a selective etching of the first core film which is formed on a whole surface on the first film to be processed in accordance with a reactive ion etching (RIE) method using a resist film as a mask.

7. The method according to claim 1, further comprising reducing a width in the second direction of the first core film and making a distance between the first core films larger than the width of the first core film, before forming the first spacer film.

8. The method according to claim 7, wherein the width of the first core film is reduced by a hydrofluoric acid process.

9. The method according to claim 1, wherein the forming of the second core film has a selective etching of the second core film which is formed on a whole surface on the second film to be processed by a reactive ion etching (RIE) method using a resist film as a mask.

10. The method according to claim 1, further comprising reducing a width in the first direction of the second core film and making a distance between the second core films larger than the width of the second core film, before forming the second spacer film.

11. The method according to claim 10, wherein the width of the second core film is reduced by a hydrofluoric acid process.

12. The method according to claim 1, wherein the second core film is arranged in the second direction more densely in the first array portion than in the second array portion.

13. The method according to claim 1, further comprising forming of a stopper film of a different material from the first film to be processed and the first core film on the first film to be processed, before forming the first core film.

14. The method according to claim 1, wherein the forming of the first film to be processed has forming of a tungsten film on a silicon substrate, and forming of a tetraethoxysilane (TEOS) on the tungsten film.

15. The method according to claim 1, further comprising forming of a stopper film of a different material from the second film to be processed and the second core film on the second film to be processed, before forming the second core film.

16. The method according to claim 1, wherein the forming of the second film to be processed has forming of a tungsten film on the first line pattern and the loop portion, and forming of a tetraethoxysilane (TEOS) on the tungsten film.

17. The method according to claim 1, wherein the forming of the first spacer film has etching back of the silicon film after forming the silicon film in such a manner as to cover a top surface and a side surface of the first core film in a conformal manner.

18. The method according to claim 1, wherein the forming of the second spacer film has etching back of the silicon film after forming the silicon film in such a manner as to cover a top surface and a side surface of the second core film in a conformal manner.

19. The method according to claim 1, wherein the first space is larger than 0 nm and less than 50 nm and the second space is larger than 50 nm and less than 100 nm.

20. The method according to claim 1, wherein the second array portion of the second core film is formed on accordance with a closed loop shaped plane pattern, and the loop portion of the first line pattern of the first film to be processed is positioned below the second space in an inner side of the closed loop.

* * * * *